(12) United States Patent
Tai et al.

(10) Patent No.: US 11,632,093 B2
(45) Date of Patent: Apr. 18, 2023

(54) ACOUSTIC WAVE DEVICES AND A METHOD OF PRODUCING THE SAME

(71) Applicant: NGK INSULATORS, LTD., Nagoya (JP)

(72) Inventors: Tomoyoshi Tai, Inazawa (JP); Masahiko Namerikawa, Seto (JP); Yudai Uno, Nagoya (JP); Ryosuke Hattori, Ichinomiya (JP); Keiichiro Asai, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 1058 days.

(21) Appl. No.: 16/365,160

(22) Filed: Mar. 26, 2019

(65) Prior Publication Data

US 2019/0222189 A1 Jul. 18, 2019

Related U.S. Application Data

(63) Continuation of application No. PCT/JP2018/032772, filed on Sep. 4, 2018.

(30) Foreign Application Priority Data

Sep. 15, 2017 (JP) .............................. JP2017-177477

(51) Int. Cl.
*H03H 3/10* (2006.01)
*H03H 9/25* (2006.01)
(Continued)

(52) U.S. Cl.
CPC ............. *H03H 3/10* (2013.01); *H01L 41/187* (2013.01); *H01L 41/312* (2013.01); *H01L 41/35* (2013.01);
(Continued)

(58) Field of Classification Search
CPC .. H03H 3/10; H03H 3/02; H03H 3/08; H03H 9/02047; H03H 9/02559; H03H 9/02574;
(Continued)

(56) References Cited

U.S. PATENT DOCUMENTS 5,446,330 A 8/1995 Eda et al.
6,767,749 B2 7/2004 Kub et al.
(Continued)

FOREIGN PATENT DOCUMENTS

CN 1665131 A 9/2005
CN 105794108 A 7/2016
(Continued)

OTHER PUBLICATIONS

Japanese language International Search Report dated Nov. 20, 2018 issued in PCT/JP2018/032772 (3 pages).
(Continued)

*Primary Examiner* — Rakesh B Patel
*Assistant Examiner* — Jorge L Salazar, Jr.
(74) *Attorney, Agent, or Firm* — Flynn Thiel, P.C.

(57) ABSTRACT

An acoustic wave device includes a piezoelectric material substrate, an intermediate layer on the piezoelectric material substrate and composed of one or more materials selected from the group consisting of silicon oxide, aluminum nitride and sialon. A bonding layer is on the intermediate layer and is composed of one or more materials selected from the group consisting of tantalum pentoxide, niobium pentoxide, titanium oxide, mullite, alumina, and a high resistance silicon and hafnium oxide. A supporting body is composed of a polycrystalline ceramic and is bonded to the bonding layer by direct bonding, and an electrode is on the piezoelectric material substrate.

6 Claims, 3 Drawing Sheets

(51) Int. Cl.
  *H03H 9/02* (2006.01)
  *H03H 3/08* (2006.01)
  *H03H 3/02* (2006.01)
  *H01L 41/187* (2006.01)
  *H01L 41/35* (2013.01)
  *H01L 41/312* (2013.01)

(52) U.S. Cl.
  CPC ............... *H03H 3/02* (2013.01); *H03H 3/08* (2013.01); *H03H 9/02047* (2013.01); *H03H 9/02559* (2013.01); *H03H 9/02574* (2013.01); *H03H 9/02614* (2013.01); *H03H 9/02834* (2013.01); *H03H 9/25* (2013.01)

(58) Field of Classification Search
  CPC .. H03H 9/02614; H03H 9/02834; H03H 9/25; H01L 41/187; H01L 41/312; H01L 41/35
  USPC .......................................... 333/133, 193–196
  See application file for complete search history.

(56) References Cited

U.S. PATENT DOCUMENTS

| | | | |
|---|---|---|---|
| 8,736,141 B2 | 5/2014 | Iwamoto | |
| 9,246,462 B2 | 1/2016 | Iwamoto | |
| 9,647,199 B2 | 5/2017 | Ito | |
| 2004/0226162 A1* | 11/2004 | Miura | H03H 3/08 29/595 |
| 2005/0194864 A1 | 9/2005 | Miura et al. | |
| 2011/0135123 A1* | 6/2011 | Kim | H04R 31/006 381/190 |
| 2014/0130319 A1* | 5/2014 | Iwamoto | H03H 3/02 29/25.35 |
| 2016/0049469 A1 | 2/2016 | Yoshikawa et al. | |
| 2016/0277003 A1 | 9/2016 | Kikuchi et al. | |
| 2017/0077897 A1 | 3/2017 | Otsubo et al. | |
| 2017/0366165 A1* | 12/2017 | Shih | H03H 9/64 |
| 2019/0036008 A1 | 1/2019 | Tai et al. | |

FOREIGN PATENT DOCUMENTS

| | | |
|---|---|---|
| CN | 106256087 A | 12/2016 |
| JP | 2003-273691 A | 9/2003 |
| JP | 3187231 U | 10/2013 |
| JP | 2014-86400 A | 5/2014 |
| JP | 2016-100729 A | 5/2016 |
| WO | 2012/043615 A1 | 4/2012 |
| WO | 2012/043616 A1 | 4/2012 |
| WO | 2012/124648 A1 | 9/2012 |
| WO | 2014/192597 A1 | 12/2014 |
| WO | 2017/163723 A1 | 9/2017 |
| WO | 2018/151147 A1 | 8/2018 |

OTHER PUBLICATIONS

Japanese language Written Opinion dated Nov. 20, 2018 issued in PCT/JP2018/032772 (5 pages).
Taiwanese Notice of Office Action issued in corresponding Taiwan Application No. 107132156 dated Apr. 22, 2021 (10 pages).

* cited by examiner

ACOUSTIC WAVE DEVICES AND A METHOD OF PRODUCING THE SAME

CROSS-REFERENCE TO RELATED APPLICATIONS

This application is a continuation of PCT/JP2018/032772, filed Sep. 4, 2018, which claims priority to Japanese Application No. 2017-177477, filed Sep. 15, 2017, the entire contents of which are hereby incorporated by reference.

TECHNICAL FIELD

The present invention relates to an acoustic wave device having a bonded body of a piezoelectric material substrate and a supporting body made of a polycrystalline ceramic.

BACKGROUND ARTS

An acoustic wave device functioning as a filter device or oscillator used in mobile phones or the like and an acoustic wave device such as a lamb wave device or film bulk acoustic resonator (FBAR) using a piezoelectric thin film, are known. An acoustic wave device may be produced by adhering a supporting body and a piezoelectric substrate propagating a surface acoustic wave and by providing interdigitated electrodes capable of oscillating the surface acoustic wave on a surface of the piezoelectric substrate. By adhering the supporting body, whose thermal expansion coefficient is lower than that of the piezoelectric substrate onto the piezoelectric substrate, the change of a size of the piezoelectric substrate responsive to temperature change is reduced so that the change of the frequency characteristics as the surface acoustic wave device is reduced.

According to patent document 1, two piezoelectric single crystal bodies are laminated and directly bonded to obtain a bonded body and an electrode is provided on the bonded body to produce a surface acoustic wave device. The direct bonding is performed by thermal treatment.

In the case that a silicon substrate is bonded to the piezoelectric single crystal substrate by direct bonding, a plasma activation method is generally applied. However, according to the plasma activation method, heating is required for improving the strength after bonding and the bonding strength tends to be low when the bonding is performed at a low temperature. However, as the bonding temperature increases, cracks tend to occur due to a difference of thermal expansion coefficients of the silicon substrate and piezoelectric substrate.

A direct bonding method of so-called FAB (Fast Atom Beam) system is also known (Patent document 2). According to this method, a neutralized atomic beam is irradiated onto each bonding face to activate it, followed by direct bonding.

PRIOR TECHNICAL DOCUMENTS

Patent Documents (Patent document 1) JP 2003-273691A
(Patent document 2) JP 2014-086400A

SUMMARY OF THE INVENTION

Objects to be Solved by the Invention

The inventors tried to bond a piezoelectric material substrate onto a polycrystalline ceramic substrate and to provide an electrode thereon to produce a surface acoustic wave device, based on patent documents 1 and 2. However, when the device was produced, the Q value was lowered such that the temperature characteristic deteriorated.

An object of the present invention is, in an acoustic wave device of the type of directly bonding a piezoelectric material substrate onto a supporting body composed of a polycrystalline ceramic, to improve the Q-value of the acoustic eave device.

Solution for the Object

An embodiment of the acoustic wave device of the present invention comprises:

a piezoelectric material substrate;

an intermediate layer provided on the piezoelectric material substrate, the intermediate layer comprising one or more materials selected from the group consisting of silicon oxide, aluminum nitride and sialon;

a bonding layer provided on said intermediate layer, the bonding layer comprising one or more materials selected from the group consisting of tantalum pentoxide, niobium pentoxide, titanium oxide, mullite, alumina, a high resistance silicon and hafnium oxide;

a supporting body comprising a polycrystalline ceramic and bonded to the bonding layer by direct bonding; and an electrode provided on the piezoelectric material substrate.

An embodiment of the present invention provides a method of producing an acoustic wave device, said method comprising the steps of:

providing an intermediate layer on a piezoelectric material substrate, the intermediate layer comprising one or more elements selected from the group consisting of silicon oxide, aluminum nitride, and sialon;

providing a bonding layer on the intermediate layer, the bonding layer comprising one or more materials selected from the group consisting of tantalum pentoxide, niobium pentoxide, titanium oxide, mullite, alumina, a high resistance silicon and hafnium oxide;

irradiating a neutralized beam onto a surface of the bonding layer to provide an activated surface;

irradiating a neutralized beam onto a surface of a supporting body comprising a polycrystalline ceramic to provide an activated surface;

bonding the activated surface of the bonding layer and the activated surface of the supporting body by direct bonding; and providing an electrode on the piezoelectric material substrate.

Effects of the Invention

The present inventors studied the cause of the reduction of the Q-value of the acoustic wave device of the type of directly bonding a piezoelectric material substrate onto a supporting body composed of a polycrystalline ceramic. The following findings were thereby obtained.

That is, an acoustic wave to be targeted should primarily propagate only in the piezoelectric material substrate. However, in the acoustic wave device type of directly bonding the piezoelectric material substrate onto the supporting body composed of the polycrystalline ceramic, it is observed that a fine amorphous layer is generated along a bonding interface, a part of an acoustic wave propagates in the amorphous layer and the propagating acoustic wave is leaked from the amorphous layer and further propagates in the supporting body. As a result, it is found that the Q-value of the acoustic wave device is deteriorated.

Thus, the inventors tried to separately form an intermediate layer and a bonding layer composed of the materials described above and different from each other on the piezoelectric material substrate. The bonding layer is then subjected to the direct bonding with the supporting body composed of the polycrystalline ceramic. As a result, it is found that the Q-value of the acoustic wave device is considerably improved.

Although the reasons are not clear, in the thus obtained acoustic wave device, the acoustic wave leaked out from the piezoelectric material substrate propagates in the intermediate layer at a relatively high efficiency and is blocked at the interface with the bonding layer whose material is different from that of the intermediate layer, so that the propagation intensity in the bonding layer is lowered. It is considered that the propagation at the interface (particularly in the amorphous layer) of the bonding layer and supporting substrate and in the supporting body are suppressed so that the Q-value is increased.

MODES FOR CARRYING OUT THE INVENTION

Figure 1A:
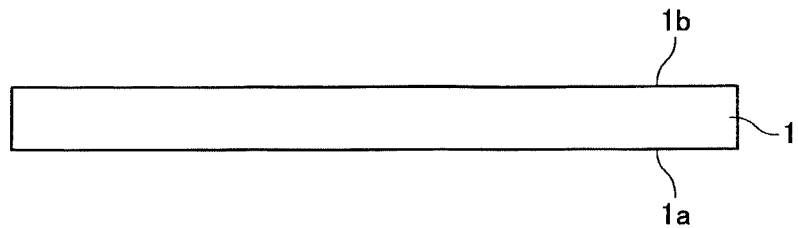
FIG. 1(a) is a view schematically showing a piezoelectric material substrate.

The present invention will be further described in detail appropriately referring to the drawings.

Figure 1B:
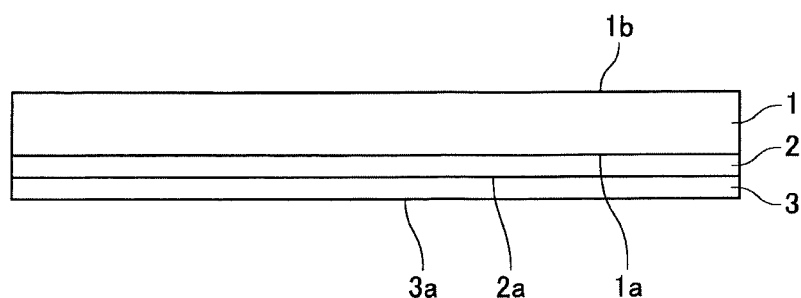
FIG. 1(b) is a view schematically showing the state that an intermediate layer and bonding layer are provided over the piezoelectric material substrate.
Figure 1C:
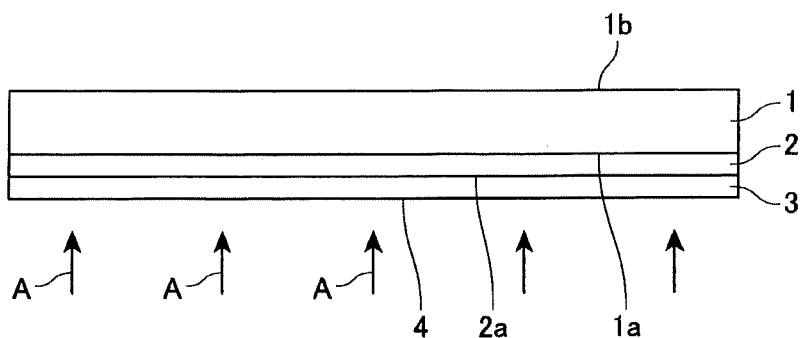
FIG. 1(c) shows the state that a surface of the bonding layer is subjected to activation treatment.

As shown in FIG. 1(a), a piezoelectric material substrate 1 includes surfaces 1a and 1b. As shown in FIG. 1(b), an intermediate layer 2 is provided on the surface 1a of the piezoelectric material substrate 1, and a bonding layer 3 is provided on the surface 2a of the intermediate layer 2. As shown in FIG. 1(c), a neutralized beam is irradiated onto a surface 3a of the bonding layer 3 to activate the surface of the bonding layer 3 to provide an activated surface 4.

Figure 2A:
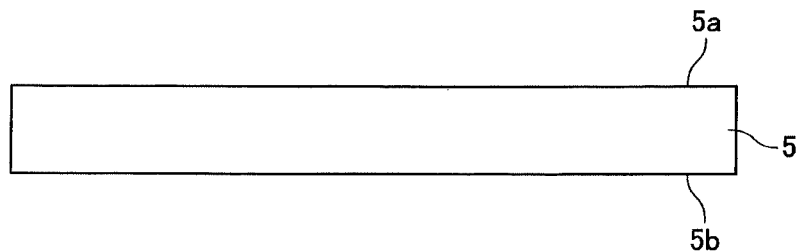
FIG. 2(a) is a view schematically showing a supporting body.
Figure 2B:
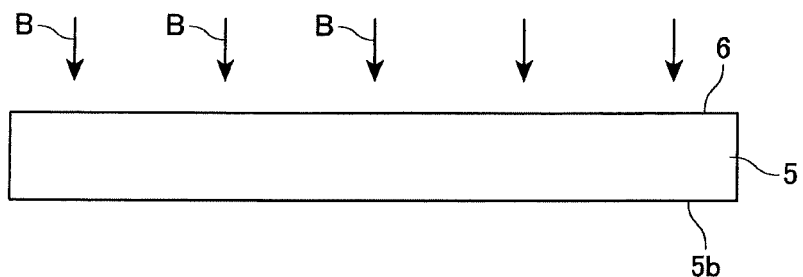
FIG. 2(b) is a view schematically showing the state that a surface of the supporting body is subjected to activation treatment.
Figure 2C:
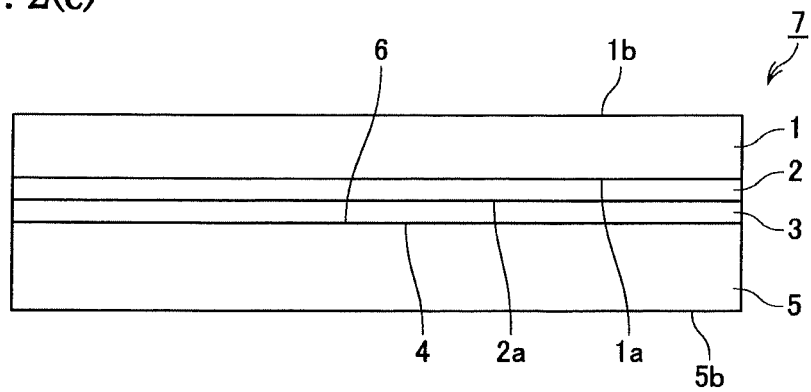
FIG. 2(c) is a view schematically showing the state that the bonding layer and supporting body are bonded by direct bonding.

Further, as shown in FIG. 2(a), a supporting body 5 composed of a polycrystalline ceramic is prepared. The supporting body 5 includes a pair of surfaces 5a and 5b. As shown in FIG. 2(b), a neutralized beam is irradiated onto the surface 5a of the supporting body 5 to activate the surface to provide an activated surface 6. As shown in FIG. 2(c), the activated surface 6 of the supporting body 5 and activated surface 4 of the bonding layer 3 are directly bonded to obtain a bonded body 7.

Figure 3A:
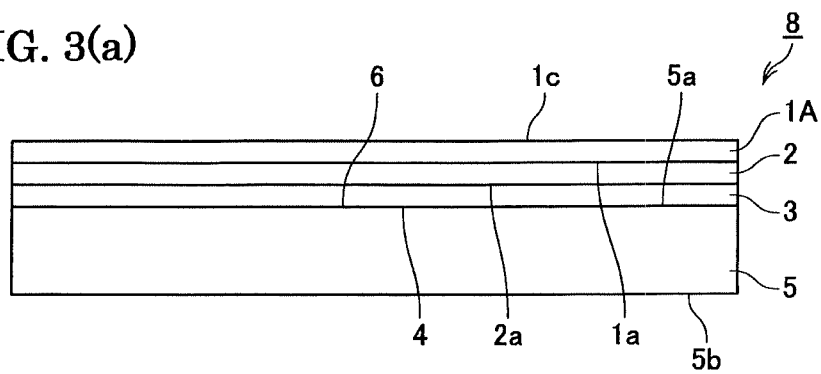
FIG. 3(a) is a view schematically showing the state that a piezoelectric material substrate is thinned by processing.

According to a preferred embodiment, the surface 1b of the piezoelectric material substrate 1 of the bonded body 7 is further subjected to polishing so that the thickness of the piezoelectric material substrate 1A is made smaller, as shown in FIG. 3(a). 1c represents a polished surface. A bonded body 8 is thus obtained.

Figure 3B:
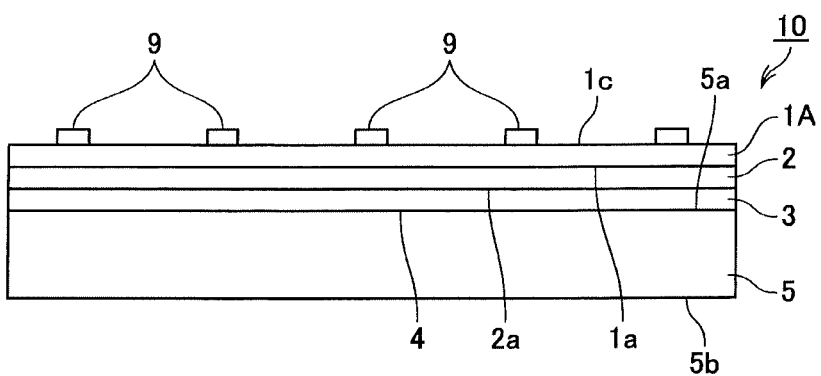
FIG. 3(b) is a view schematically showing the state that an electrode is provided on the piezoelectric material substrate.

According to FIG. 3(b), predetermined electrodes 9 are formed on the polished surface 1c of the piezoelectric material substrate 1A to produce an acoustic wave device 10.

The effects of the present invention will be supplemented further referring to FIG. 3.

An acoustic wave to be targeted should primarily propagate only in the piezoelectric material substrate 1A. However, in the acoustic wave device type of directly bonding the piezoelectric material substrate 1A onto the supporting body 5 composed of the polycrystalline ceramic, it is observed that a fine amorphous layer is generated along an interface, a part of an acoustic wave propagates in the amorphous layer, and the propagating acoustic wave leaks from the amorphous layer and further propagates in the supporting body 5. As a result, it is found that the Q-value of the acoustic wave device is deteriorated.

On the other hand, according to the acoustic wave device 10 of the present invention, the intermediate layer 2 and bonding layer 3 composed of the different and specific kinds of materials described above are separately formed on the piezoelectric material substrate 1A, and the bonding layer 3 is directly bonded to the supporting body 5 composed of the polycrystalline ceramic. As a result, it is found that the Q-value of the acoustic wave device is considerably improved.

Although the reasons are not clear, in the thus obtained acoustic wave device, the acoustic wave which leaked out from the piezoelectric material substrate 1A propagates in the intermediate layer 2 at a relatively high efficiency and blocked at the interface with the bonding layer 3 whose material is different from that of the intermediate layer 2, so that the propagation intensity in the bonding layer 3 is lowered. It is thought that the propagation at the interface (particularly in the amorphous layer) of the bonding layer 3 and supporting body 5 and in the supporting body 5 is thereby suppressed so that the Q-value is increased.

Respective constituents of the present invention will be described further in detail below.

As an acoustic wave device, a surface acoustic wave device, a Lamb wave-type device, and a thin film resonator (FBAR) or the like are known. For example, the surface acoustic wave device is produced by providing input side IDT (Interdigital transducer) electrodes (also referred to as comb electrodes or interdigitated electrodes) for an oscillating surface acoustic wave and an IDT electrode on the output side for receiving the surface acoustic wave, on the surface of the piezoelectric single crystal substrate. By applying a high frequency signal on the IDT electrodes on the input side, an electric field is generated between the electrodes, so that the surface acoustic wave is oscillated and propagated on the piezoelectric substrate. Then, the propagated surface acoustic wave is drawn as an electrical signal from the IDT electrodes on the output side provided in the direction of the propagation.

A metal film may be provided on a bottom surface of the piezoelectric single crystal substrate 1A. After the Lamb type device is produced as the acoustic wave device, the metal film plays a role of improving the electro-mechanical coupling factor near the bottom surface of the piezoelectric substrate. In this case, the Lamb type device has the structure that interdigitated electrodes are formed on the surface of the piezoelectric substrate and that the metal film on the piezoelectric substrate is exposed through a cavity provided in the supporting body. Materials of such metal films include aluminum, an aluminum alloy, copper, gold or the like, for example. Further, in the case that the Lamb type wave device is produced, a composite substrate having the piezoelectric substrate without the metal film on the bottom surface may be used.

Further, a metal film and an insulating film may be provided on the bottom surface of the piezoelectric material substrate 1A. The metal film plays a role of electrodes in the case that the thin film resonator is produced as the acoustic wave device. In this case, the thin film resonator has a structure such that electrodes are formed on the upper and bottom surfaces of the piezoelectric substrate and the insulating film is a cavity to expose the metal film on the piezoelectric substrate. Materials of such metal films include molybdenum, ruthenium, tungsten, chromium, aluminum or the like, for example. Further, materials of the insulating films include silicon dioxide, phosphorus silicate glass, boron phosphorus silicate glass or the like.

Specifically, as the material of the piezoelectric material substrate 1A, single crystals of lithium tantalate (LT), lithium niobate (LN), lithium niobate-lithium tantalate solid solution, quartz and lithium borate may be listed. Among them, LT or LN are more preferred.

As LT or LN each has a high propagation speed of a surface acoustic wave and a large electro-mechanical coupling factor, it is preferred for use in a piezoelectric surface wave device for high frequency and wide-band frequency applications. Further, the normal direction of the main surface of the piezoelectric material substrate is not particularly limited. However, in the case that the piezoelectric material substrate 1A is made of LT, for example, it is preferred to use the substrate rotated toward the Y-axis or Z-axis by 36 to 47° (for example 42°) with respect to the X-axis, which is a direction of propagation of a surface acoustic wave, because of a low propagation loss. In the case that the piezoelectric material substrate 1A is made of LN, it is preferred to use the substrate rotated toward the Y-axis or Z-axis by 60 to 68° (for example 64°) with respect to the X-axis, which is a direction of propagation of a surface acoustic wave, because of a lower propagation loss. Further, although the size, of the piezoelectric material substrate is not particularly limited, for example, the diameter may be 50 to 150 mm and thickness may be 0.2 to 60 μm.

The supporting body 5 is made of a polycrystalline ceramic. It is preferably a material selected from the group consisting of mullite, aluminum nitride and sialon.

Further, the relative density of the ceramic forming the supporting body 5 may preferably be 95 percent or higher and may be 100 percent. The relative density is measured by Archimedes' method.

The intermediate layer 2 is composed of a material selected from the group consisting of silicon oxide, aluminum nitride and sialon. The efficiency of propagation of the acoustic wave can be improved by intervening the intermediate layer 2.

The thickness of the intermediate layer 2 may preferably be 0.25 μm or larger and more preferably 0.5 μm or larger, on the viewpoint of suppressing the leakage of the acoustic wave into the bonding layer 3 and supporting body 5. Further, the thickness of the intermediate layer 2 may preferably be 5.0 μm or smaller on the viewpoint of cost for film-formation and warp amount of the substrate.

The bonding layer 3 is provided on the intermediate layer 2. The bonding layer 3 is composed of one or more materials selected from the group consisting of tantalum pentoxide, niobium pentoxide, titanium oxide, mullite, alumina, a high resistance silicon and hafnium oxide. It becomes easier to suppress the leakage of the acoustic wave from the intermediate layer by providing such bonding layer 3. The thickness of the bonding layer may preferably be 0.01 μm or larger and may preferably be 1.0 μm or smaller. Further, high resistance silicon means silicon having a volume resistivity of 1000Ω·cm or larger.

Further, on the viewpoint of improving the Q-value, the thickness of the intermediate layer/the thickness of bonding layer may preferably be 5 to 25 and more preferably be 10 to 20.

A neutralized beam is irradiated onto the surface 5a of the supporting body 5 composed of the polycrystalline ceramic and the surface 3a of the bonding layer 3 to activate them. In this case, preferably, the surface 3a of the bonding layer 3 and the surface 5a of the supporting body 5 may be flattened to obtain flattened surfaces. Here, lapping, chemical mechanical polishing (CMP) or the like may be used as the method of flattening the respective surfaces. Further, the flattened surface necessarily has an Ra of 1 nm or lower and more preferably an Ra of 0.3 nm or lower.

When the activation of the surfaces is performed using the neutralized beam, it is preferred to use a system described in patent document 2 to generate the neutralized beam, which is irradiated. That is, a high-speed atomic beam source of saddle field type is used as the beam source. Then, an inert gas is introduced into the chamber and a high voltage is applied onto the electrodes from a direct current electric source. By this, an electric field of saddle field type generated between the electrode (positive electrode) and a housing (negative electrode) causes motion of electrons, e, so that atomic and ion beams derived from the inert gas are generated. Among the beams reached at a grid, the ion beam is neutralized at the grid, and the beam of neutral atoms is emitted from the high speed atomic beam source. Atomic species forming the beam may preferably be an inert gas (argon, nitrogen or the like).

The voltage during the activation by the irradiation of the beam may preferably be 0.5 to 2.0 kV and the current is preferably 50 to 200 mA.

Then, the activated surfaces are contacted and bonded with each other under vacuum atmosphere. The temperature at this time may be ambient temperature, specifically 40° C. or lower and more preferably 30° C. or lower. Further, the temperature during the bonding may more preferably be 20° C. or higher and 25° C. or lower. The pressure during the bonding is preferably 100 to 20000N.

According to a preferred embodiment, an amorphous layer is generated along an interface of the supporting body 5 and bonding layer 3. Such amorphous layer may be made of a mixture or composition of the material of the supporting body 5 and material of the bonding layer 3 in many cases. Further, an atomic specie (argon, nitrogen or the like) constituting the neutralized beam used for the surface activation may be present as a part of the composition. Thus, the amorphous layer may be formed with the atom constituting the supporting body 5, the atom constituting the bonding layer 3 and the atom constituting the neutralized beam mixed together. Further, the thickness of the amorphous layer may be 20 nm or smaller in many cases.

The presence of the amorphous layer can be confirmed as follows.

A transmission type electron microscope (supplied by JEOL Ltd., JEM-ARM200F) is used as a measurement system to observe the microstructure. As to the conditions of measurement, a thinned sample is observed by the FIB (focused ion beam) method at an accelerating voltage of 200 kV.

EXAMPLES

Inventive Example A1

An acoustic wave device 10 shown in FIG. 3(b), according to the method described referring to FIGS. 1 to 3, was produced.

Specifically, a lithium tantalate (LT substrate) having an orientation flat part (OF), a diameter of 4 inches and thickness of 250 μm, was used as the piezoelectric material substrate 1. Further, as the supporting body 5, a sialon substrate having an OF part, a diameter of 4 inches and thickness of 230 μm was prepared. The LT substrate of 46° Y-cut X-propagation LT substrate, in which an acoustic surface wave (SAW) propagated in X-direction and the cutting angle was rotated Y-cut plate, was used. The surface 1a of the piezoelectric material substrate 1 and the surface 5a of the supporting body 5 were mirror-polished so that the arithmetic surface roughnesses Ra were 1 nm. The arithmetic surface roughenesses were evaluated in a square visual field of a length of 10 μm and a width of 10 μm by means of an atomic force microscope (AFM).

An intermediate layer 2 having a thickness of 0.5 μm and composed of silicon oxide on the surface 1a of the piezoelectric material substrate 1 was then film-formed by sputtering. The arithmetic average surface roughness Ra after the film formation was 2 nm. The bonding layer 3 having a thickness of 0.01 μm and composed of tantalum pentoxide on the intermediate layer 2 was then film-formed by the CVD method. Ra after the film-formation was 2.0 nm. The surface of the bonding layer 3 was then subjected to chemical mechanical polishing (CMP) to flatten it so that its Ra reached 0.2 nm. The sialon substrate as the supporting body 5 was subjected to mechanical polishing using ultra-fine abrasives of 0 5 μm or smaller to flatten it to Ra of 0.5 nm or lower, without performing chemical mechanical polishing (CMP).

The surface 3a of the bonding layer 3 and the surface 5a of the supporting body 5 were washed and subjected to removal of contamination, and the substrates were introduced in a vacuum chamber. The inside of the chamber was evacuated to about $10^{-6}$ Pa, and a high-speed atomic beam (at an acceleration voltage of 1 KV and Ar flow rate of 27 sccm) was irradiated onto each of the bonding faces of the substrate and body for 120 sec. The beam-irradiated face (activated surface) 4 of the bonding layer 3 and activated surface 6 of the supporting body were contacted with each other and then subjected to pressurizing at 10000N for 2 minutes so that the substrates were bonded with each other. Thus, a bonding interface is formed between the bonding layer 3 and supporting body 5 (In other words, the amorphous layer is present along the interface between the bonding layer 3 and supporting body 5).

The surface 1b of the piezoelectric material substrate 1 was ground and polished so that the thickness was changed from the initial 250 μm to 3 μm (refer to FIG. 3(a)). The peeling of the bonded region was not confirmed during the grinding and polishing. Further, the bonding strength was evaluated by a crack opening method and proved to be 2.0 J/m.

As shown in FIG. 3(b), the electrode 9 was provided on the polished face 1c of the piezoelectric material substrate 1A to produce the acoustic device 10. The Q value and wavelength λ of the surface acoustic wave of the thus obtained device 10 were measured. The results are shown in Table 1.

Inventive Examples A2 to A5

Acoustic devices 10 were produced according to the similar procedure as inventive example A1. However, the thickness of the bonding layer 3 was changed as shown in Table 1 (specifically, the thickness of the bonding layer 3 was 0.02 μm in the inventive example A2, 0.05 μm in the inventive example A3, 0.1 μm in the inventive example A4, and 0.5 μm in the inventive example A5). The Q value and wavelength of the surface acoustic wave of the thus obtained device 10 were measured, and the results are shown in Table 1. Further, according to the inventive examples A2 to A5, a bonding interface is present between the bonding layer 3 and supporting body 5.

Comparative Example 1

An acoustic device was produced as Inventive Example A1. However, the bonding layer 3 was not formed and the surface of the intermediate layer 2 and the surface of the supporting body 5 were bonded by direct bonding. The Q-value and the wavelength λ of the surface acoustic wave of the thus obtained device were measured, and the results are shown in Table 1. Further, the bonding interface was present between the intermediate layer 2 and supporting body 5 in comparative example A1.

Comparative Example A2

An acoustic wave device was produced as Inventive Example A3 (Thickness of the bonding layer was 0.05 μm). However, the bonding layer 3 and supporting body 5 were not directly bonded. Instead, the intermediate layer 2 and piezoelectric material substrate 1A were bonded by direct bonding according to the procedure of the inventive example A3. The Q value and wavelength λ of the surface acoustic wave of the thus obtained device were measured, and the results are shown in Table 1. Further, the bonding interface was present between the intermediate layer 2 and piezoelectric material substrate 1A, according to comparative example A2.

Comparative Example A3

An acoustic wave device was produced according to the similar procedure as inventive example A1. However, the bonding layer 3 was not provided, and the intermediate layer 2 and piezoelectric material substrate 1A were directly bonded according to the same procedure as inventive example A1. The Q value and wavelength λ of the surface acoustic wave of the thus obtained device were measured, and the results are shown in Table 1. Further, the bonding interface was present between the intermediate layer 2 and piezoelectric material substrate 1A, according to comparative example 3.

TABLE 1

| | Intermediate layer 2 (Thickness) | Bonding layer 3 (Thickness) | Supporting Body 5 | Binding interface | Q value | Wavelength of acoustic wave (μm) |
|---|---|---|---|---|---|---|
| Inv. Ex. A1 | SiO2 (0.5 μm) | Ta2O5 (0.01 μm) | Sialon | Between bonding layer 3 and supporting body 5 | 1100 | 2 |
| Inv. Ex. A2 | SiO2 (0.5 μm) | Ta2O5 (0.02 μm) | Sialon | Between bonding layer 3 and supporting body 5 | 2400 | 2 |
| Inv. Ex. A3 | SiO2 (0.5 μm) | Ta2O5 (0.05 μm) | Sialon | Between bonding layer 3 and supporting body 5 | 2500 | 2 |
| Inv. Ex. A4 | SiO2 (0.5 μm) | Ta2O5 (0.1 μm) | Sialon | Between bonding layer 3 and supporting body 5 | 2000 | 2 |
| Inv. Ex. A5 | SiO2 (0.5 μm) | Ta2O5 (0.5 μm) | Sialon | Between bonding layer 3 and supporting body 5 | 1200 | 2 |
| Com. Ex. A1 | SiO2 (0.5 μm) | None | Sialon | Between intermediate layer 2 and supporting body 5 | 500 | 2 |
| Com. Ex. A2 | SiO2 (0.5 μm) | Ta2O5 (0.05 μm) | Sialon | Between intermediate layer 2 and piezoelectric single crystal substrate | 600 | 2 |
| Com. Ex. A3 | SiO2 (0.5 μm) | None | Sialon | Between intermediate layer 2 and piezoelectric single crystal substrate | 300 | 2 |

As can be seen from Table 1, according to inventive examples A1 to A5, the Q value is relatively higher (Q value: 1100 to 2500). For comparative examples A1 to A3, the Q values are considerably lower than the Q value in the inventive example A1.

As to the reason, according to comparative example A1 (Q value: 500), a bonding layer 3 is not present. It is thought that a part of the acoustic wave propagating in the intermediate layer 2 propagates in the supporting substrate 5 and in the amorphous layer at the interface of the intermediate layer 2 and supporting body 5, so that the propagation efficiency is lowered. According to comparative example A2 (Q value: 600), it is thought that the intermediate layer 2 and piezoelectric material substrate 1A are directly bonded so that the propagation efficiency is lowered due to the amorphous layer present along the interface between the piezoelectric material substrate 1A and intermediate layer 2.

According to comparative example A3 (Q value: 300), a bonding layer 3 is not present, and the intermediate layer 2 and piezoelectric material substrate 1A are directly bonded. It is thus thought that a part of the acoustic wave propagating in the intermediate layer 2 and amorphous layer present along the interface between the piezoelectric material substrate 1A and intermediate layer 2 is leaked out into the supporting body 5 so that the propagation efficiency is the lowest.

Particularly, as shown in inventive examples A2 to A4, in the case that the ratio of the thickness of the intermediate layer 2/the thickness of bonding layer 3 is 5 to 25, the Q value can be considerably improved (Q values: 2000 to 2500).

Inventive Examples B1 and B2

Acoustic wave devices were produced according to the same procedure as inventive example A3, except that the material of the intermediate layer 2 was changed to aluminum nitride or sialon. The Q value and wavelength λ of the surface acoustic wave of the thus obtained device 10 were measured, and the results are shown in Table 2. Further, according to inventive examples B1 and B2, a bonding interface is present between the bonding layer 3 and supporting body 5 as in inventive example A3.

Inventive Examples B3 to B6

Acoustic wave devices were produced as inventive example A3, except that the material of the bonding layer 3 was changed to niobium pentoxide, titanium oxide, mullite or alumina. The Q value and the wavelength λ of the surface acoustic wave of the thus obtained device 10 were measured and the results are shown in Table 2. Further, according to inventive examples B3 to B6, a bonding interface is present between the bonding layer 3 and supporting body 5, as in inventive example A3.

Inventive Examples B7 and B8

Acoustic wave devices were produced as inventive example A3, except that the material of the supporting body 5 was changed to mullite or aluminum nitride. The Q value and the wavelength λ of the surface acoustic wave of the thus obtained device 10 were measured and the results are shown in Table 2. Further, a bonding interface was present between the bonding layer 3 and supporting body 5, according to inventive examples B7 and B8.

TABLE 2

| | Intermediate layer 2 | Bonding layer 3 | Supporting Body 5 | Bonding interface | Q value | Wavelength λ of acoustic wave (μm) |
|---|---|---|---|---|---|---|
| Inv. Ex. B1 | AlN (0.5 μm) | Ta2O5 (0.05 μm) | Sialon | Between bonding layer 3 and supporting body 5 | 2400 | 2 |
| Inv. Ex. B2 | Sialon (0.5 μm) | Ta2O5 (0.05 μm) | Sialon | Between bonding layer 3 and supporting body 5 | 2450 | 2 |
| Inv. Ex. B3 | SiO2 (0.5 μm) | Nb2O5 (0.05 μm) | Sialon | Between bonding layer 3 and supporting body 5 | 2420 | 2 |
| Inv. Ex. B4 | SiO2 (0.5 μm) | TiO2 (0.05 μm) | Sialon | Between bonding layer 3 and supporting body 5 | 2430 | 2 |
| Inv. Ex. B5 | SiO2 (0.5 μm) | Mullite (0.05 μm) | Sialon | Between bonding layer 3 and supporting body 5 | 2410 | 2 |

TABLE 2-continued

| | Intermediate layer 2 | Bonding layer 3 | Supporting Body 5 | Bonding interface | Q value | Wavelength λ of acoustic wave (μm) |
|---|---|---|---|---|---|---|
| Inv. Ex. B6 | SiO2 (0.5 μm) | alumina (0.05 μm) | Sialon | Between bonding layer 3 and supporting body 5 | 2400 | 2 |
| Inv. Ex. B7 | SiO2 (0.5 μm) | Ta2O5 (0.05 μm) | Mullite | Between bonding layer 3 and supporting body 5 | 2460 | 2 |
| Inv. Ex. B8 | SiO2 (0.5 μm) | Ta2O5 (0.05 μm) | AlN | Between bonding layer 3 and supporting body 5 | 2440 | 2 |

As can be seen from Table 2, according to inventive examples B1 to B8, high Q values were obtained as for inventive example A3 (Q values: 2400 to 2460).

Further, as shown in Table 2, the ratio of the thickness of the intermediate layer 2/the thickness of bonding layer 3 was 10 as for the inventive example A3. The Q value can be considerably improved by making the ratio of the thickness of the intermediate layer 2/the thickness of bonding layer 3 from 5 to 25, as in inventive examples A2 and A4.

Inventive Examples B9 and B10

Acoustic wave devices were produced as inventive example A3, except that the material of the bonding layer 3 was changed to a high resistance silicon (HR-Si) or hafnium oxide. The Q value and wavelength λ of the surface acoustic wave of the thus obtained device 10 were measured and the results are shown in table 3. Further, according to inventive examples B9 and B10, a bonding interface was present between the bonding layer 3 and supporting body 5, as inventive example A3.

TABLE 3

| | Intermediate layer 2 (Thickness) | Bonding layer 3 (Thickness) | Supporting Body 5 | Bonding interface | Q value | Wavelength λ of acoustic wave (μm) |
|---|---|---|---|---|---|---|
| Inv. Ex. B9 | SiO2 (0.5 μm) | HR-Si | Sialon | Between bonding layer 3 and supporting body 5 | 2700 | 2 |
| Inv. Ex. B10 | SiO2 (0.5 μm) | HfO2 | Sialon | Between bonding layer 3 and supporting body 5 | 2650 | 2 |

As can be seen from Table 3, according to inventive examples B9 and B10, very high Q values were obtained (Q values: 2700 or 2650).

Further, as shown in Table 3, the ratio of the thickness of the intermediate layer 2/the thickness of the bonding layer 3 was 10 for inventive example A3. The Q value can be considerably improved, by adjusting the thickness of the intermediate layer 2/the thickness of the bonding layer 3 from 5 to 25, for inventive examples A2 and A4.

The invention claimed is:
1. An acoustic wave device comprising:
 a piezoelectric material substrate;
  an intermediate layer provided on said piezoelectric material substrate, said intermediate layer comprising one or more materials selected from the group consisting of silicon oxide, aluminum nitride and sialon;
  a bonding layer provided on said intermediate layer, said bonding layer comprising one or more materials selected from the group consisting of tantalum pentoxide, niobium pentoxide, titanium oxide, mullite, alumina, a high resistance silicon and hafnium oxide;
  a supporting body comprising a polycrystalline ceramic and bonded to said bonding layer by direct bonding; and
  an electrode provided on said piezoelectric material substrate,
  wherein a thickness of said intermediate layer is 5 times or more and 25 times or less of a thickness of said bonding layer.
2. The acoustic wave device of claim 1, wherein said bonding layer comprises the one or more materials selected from the group consisting of tantalum pentoxide, niobium pentoxide, titanium oxide, mullite, and a high resistance silicon and hafnium oxide.
3. The acoustic wave device of claim 1, further comprising an amorphous layer along an interface of said bonding layer and said supporting body.
4. A method of producing an acoustic wave device, said method comprising the steps of:
 providing an intermediate layer on a piezoelectric material substrate, said intermediate layer comprising one or more elements selected from the group consisting of silicon oxide, aluminum nitride and sialon;
 providing a bonding layer on said intermediate layer, said bonding layer comprising one or more materials selected from the group consisting of tantalum pentoxide, niobium pentoxide, titanium oxide, mullite, alumina, a high resistance silicon and hafnium oxide;
 irradiating a neutralized beam onto a surface of said bonding layer to provide an activated surface;
 irradiating a neutralized beam onto a surface of a supporting body comprising a polycrystalline ceramic to provide an activated surface;
 bonding said activated surface of said bonding layer and said activated surface of said supporting body by direct bonding; and
 providing an electrode on said piezoelectric material substrate,
 wherein a thickness of said intermediate layer is 5 times or more and 25 times or less of a thickness of said bonding layer.
5. The method of claim 4, wherein said bonding layer comprises the one or more materials selected from the group consisting of tantalum pentoxide, niobium pentoxide, titanium oxide, mullite, and a high resistance silicon and hafnium oxide.

6. The method of claim 4, further comprising the step of generating an amorphous layer along an interface of said bonding layer and said supporting body.

* * * * *